(12) United States Patent
Mizuno et al.

(10) Patent No.: US 7,385,293 B2
(45) Date of Patent: Jun. 10, 2008

(54) COPPER ALLOY, FABRICATION METHOD THEREOF, AND SPUTTERING TARGET

(75) Inventors: Masao Mizuno, Kobe (JP); Takashi Onishi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 11/229,721

(22) Filed: Sep. 20, 2005

(65) Prior Publication Data

US 2006/0068587 A1    Mar. 30, 2006

(30) Foreign Application Priority Data

Sep. 27, 2004  (JP)  ............................. 2004-280444

(51) Int. Cl.
    *H01L 23/48*    (2006.01)
(52) U.S. Cl. ............................. 257/762; 257/E23.169
(58) Field of Classification Search ................ 257/672, 257/762; 438/625, 678, 687; 427/96.1
    See application file for complete search history.

(56) References Cited

U.S. PATENT DOCUMENTS

| | | | |
|---|---|---|---|
| 6,413,330 B1 * | 7/2002 | Oishi | ........................ 148/434 |
| 7,074,709 B2 * | 7/2006 | Young | ........................ 438/625 |
| 2004/0002211 A1 * | 1/2004 | Young | ........................ 438/678 |
| 2004/0076541 A1 * | 4/2004 | Laughlin et al. | ............ 420/561 |
| 2005/0285273 A1 | 12/2005 | Okabe et al. | |
| 2006/0019496 A1 * | 1/2006 | Onishi et al. | ................ 438/687 |
| 2006/0024428 A1 * | 2/2006 | Cho | ........................ 427/96.1 |
| 2006/0113685 A1 | 6/2006 | Ueki et al. | |

FOREIGN PATENT DOCUMENTS

| | | |
|---|---|---|
| EP | 1 602 747 A1 | 12/2005 |
| JP | 11-191556 | 7/1999 |
| JP | 11-260820 | 9/1999 |
| JP | 2003-073810 | 3/2003 |
| JP | 2004-193546 | 7/2004 |
| JP | 2004-193553 | 7/2004 |
| TW | 1245805 | 12/2005 |

* cited by examiner

*Primary Examiner*—Wai-Sing Louie
(74) *Attorney, Agent, or Firm*—Oblon, Spivak, McClelland, Maier & Neustadt, P.C.

(57) ABSTRACT

A Cu alloy for semiconductor interconnections contains at least one selected from the group consisting of 0.10 to 10 atomic percent of Sb, 0.010 to 1.0 atomic percent of Bi, and 0.01 to 3 atomic percent of Dy, with the balance being Cu and inevitable impurities. The Cu alloy can be reliably embedded in narrow trenches and/or via holes for interconnections.

14 Claims, No Drawings

US 7,385,293 B2

COPPER ALLOY, FABRICATION METHOD THEREOF, AND SPUTTERING TARGET

BACKGROUND OF THE INVENTION

1. Field of the Invention

The present invention relates to semiconductor devices. Specifically, it relates to: a Cu alloy for semiconductor interconnections; a method for fabricating interconnections containing the Cu alloy; a semiconductor device having Cu alloy interconnections fabricated by the method; and a sputtering target for fabricating Cu alloy interconnections for semiconductors.

2. Description of the Related Art

Semiconductors have had higher and higher performance and must operate faster with higher packaging densities. For faster operation of semiconductors, it is effective to reduce electric resistances of interconnection films as much as possible, since high electric resistances cause delay of signal transmission. For this purpose, copper or a copper alloy (hereinafter referred to as "Cu-based metal") is replacing aluminum or an aluminum alloy (hereinafter referred to as "Al-based metal") as the material for interconnection films. In addition, the width of interconnections (hereinafter briefly referred to as "interconnection width") is preferably reduced as much as possible for enabling faster operation. The interconnection width of semiconductors has been frequently about 0.25 µm but is more and more reduced in recent years.

For larger packaging densities, interconnections are designed to have a multilayer structure, for example, by a damascene interconnection process. In the damascene process, for example, an interlayer dielectric film typically of silicon oxide is deposited on a semiconductor substrate; interconnection patterns such as grooves for embedding interconnections and holes (trenches and via holes) for connecting interconnections (hereinafter such grooves and holes are generically referred to as "grooves") are fabricated in the interlayer dielectric film; a barrier film is then deposited by sputtering; a Cu-based metal is embedded in the grooves by electroplating; and excess Cu-based metal is removed by chemical mechanical polishing (CMP) to yield interconnections. After polishing, another dielectric film is fabricated on the surface of the polished article, and the above-mentioned processes are repeated to yield multilayer interconnections.

If the grooves have large widths (namely, the interconnection width is large), a Cu-based metal can be easily embedded in the grooves by electroplating. A reducing interconnection width of semiconductors, however, inevitably induces reducing widths of grooves. Consequently, the Cu-based metal is not sufficiently embedded in the grooves and thereby fails to fabricate interconnections.

Japanese Unexamined Patent Application Publication No. 11-260820 proposes a technique for embedding a Cu-based metal in grooves (refer to claims, [0011], [0013], [0020], and [0028]) This technique is a method for embedding a copper based interconnection film under pressure. In the method, a surface of dielectric film of a substrate having holes or grooves is covered with a copper based material for interconnection films by physical vapor deposition; a gas at a high pressure and a temperature equal to or lower than the melting point of the material for interconnection films is allowed to act to make the material for interconnection films plastically flow or diffuse into the holes or grooves. The document described that film deposition by physical vapor deposition is carried out at elevated temperatures of the target member of about 200° C. to about 400° C., and then embedment by high-pressure gas is carried out. As a result of investigations by the present inventors, however, the copper-based material for interconnection films may not be embedded in the holes or grooves with decreasing widths of the holes or grooves. This technique is therefore susceptible to improvement. The document mentions a copper-based material for interconnection films mainly containing Cu and containing Sb as an alloying element. However, there is no example of such a material containing Sb, and the document fails to practically teach effects of the addition of Sb.

SUMMARY OF THE INVENTION

Under these circumstances, an object of the present invention is to provide a Cu alloy for semiconductor interconnections which can be reliably embedded in grooves having narrow widths corresponding to a narrow interconnection width of semiconductors. Another object of the present invention is to provide a method for fabricating Cu alloy interconnections by embedding the Cu alloy for semiconductor interconnections in grooves upon a semiconductor substrate. Yet another object of the present invention is to provide a semiconductor device having Cu alloy interconnections fabricated by the method. Another object of the present invention is to provide a sputtering target for fabricating Cu alloy interconnections for semiconductors.

The present inventors made intensive investigations on techniques of reliably embedding a Cu-based metal in narrow grooves. Consequently, they have found that a Cu alloy for semiconductor interconnections can be reliably embedded in grooves corresponding to a narrower interconnection width of semiconductors by strictly specifying the composition of the Cu alloy. They have also found that a Cu alloy for semiconductor interconnections can be reliably embedded in grooves corresponding to a narrower interconnection width of semiconductors by strictly controlling the average size of crystal grains of the Cu alloy. The present invention has been accomplished based on these findings.

Specifically, the present invention provides, in an aspect, a Cu alloy containing at least one selected from the group consisting of 0.10 to 10 atomic percent of Sb, 0.010 to 1.0 atomic percent of Bi, and 0.01 to 3 atomic percent of Dy, with the balance being Cu and inevitable impurities. The present invention further provides, in another aspect, a Cu alloy for semiconductor interconnections, being deposited by sputtering and comprising at least one selected from the group consisting of Sb, Bi and Dy with the balance being Cu and inevitable impurities, in which the Cu alloy has an average size of crystal grains of 0.01 to 0.15 µm immediately after deposition by sputtering at room temperature, and, when the Cu alloy is subjected to heat treatment, the Cu alloy has an increased average size of the crystal grains of 0.5 µm or more after heat treatment.

The present invention provides, in yet another aspect, a method for fabricating Cu alloy interconnections by embedding a Cu alloy in grooves in a semiconductor substrate, the grooves having a minimum width of 0.25 µm or less (excluding 0 µm) and a ratio of the depth to the minimum width of 1 or more, the method including the steps of fabricating a layer of the above-mentioned Cu alloy for semiconductor interconnections on or above a surface of the semiconductor substrate by sputtering at room temperature, and subjecting the resulting semiconductor substrate to high pressure and high temperature treatment at 200° C. or higher and 50 MPa or more to embed the Cu alloy in the grooves to thereby fabricate interconnections.

The present invention also includes a semiconductor device having Cu alloy interconnections fabricated by the method, and a sputtering target for fabricating Cu alloy interconnections for semiconductors, containing at least one selected from the group consisting of 0.10 to 12 atomic percent of Sb, 0.020 to 3 atomic percent of Bi, and 0.02 to 3.5 atomic percent of Dy, with the balance being Cu and inevitable impurities.

The "interconnections" as used in the present invention include not only linear ones but also holes (grooves) for connecting such interconnections (wiring) and refer to portions of a semiconductor device where a Cu alloy is embedded.

According to the present invention, a Cu alloy for semiconductor interconnections that can be reliably embedded in grooves corresponding to a narrower interconnection width of semiconductors can be provided by strictly specifying the composition of the Cu alloy. Another Cu alloy containing specific elements for semiconductor interconnections having similar advantages to above can be provided by strictly controlling the crystal grain size of the Cu alloy. Each of these Cu alloys for semiconductor interconnections can be reliably embedded in narrow grooves upon a semiconductor substrate to thereby fabricate Cu alloy interconnections reliably. The present invention can also provide a semiconductor device having the interconnections and a sputtering target for fabricating Cu alloy interconnections for semiconductors.

Further objects, features and advantages of the present invention will become apparent from the following description of the preferred embodiments.

DESCRIPTION OF THE PREFERRED EMBODIMENTS

The present inventors made intensive investigations to determine why pure Cu is not embedded in narrow grooves for semiconductor interconnections according to the technique disclosed in Japanese Unexamined Patent Application Publication No. 11-260820. As a result, they have found that, when a thin film of pure Cu is applied to a surface of a semiconductor substrate, the crystal grain boundary of the thin film of pure Cu is stabilized to thereby inhibit embedment of pure Cu in grooves.

Specifically, when a thin film of pure Cu is deposited, the crystal grain size of Cu is substantially equal to the thickness of the thin film. Even if pure Cu after film deposition is pressed toward grooves by using a high-pressure gas, the pure Cu can not be embedded in narrow grooves, since the crystal grain boundaries at boundary surfaces of crystal grains of Cu are stabilized. If a deposited thin film of pure Cu has a thickness of, for example, 1 μm, crystal grains of Cu in the thin film grow to a size of about 1 μm. Thus, crystal grain boundaries in the thin film are formed so as to penetrate the thin film. The resulting crystal grain boundaries penetrating the thin film are relatively stable, and the crystal grains of Cu are resistant to movement and deformation even under pressure. Consequently, the pure Cu is not embedded in narrow grooves.

The present inventors made further investigations, while supposing that crystal grains of Cu may move and deform upon pressurization to embed Cu even in narrow grooves by preventing crystal grain boundaries from penetrating the thin film and thereby making crystal grain boundaries unstable. Consequently, they have found that, by employing sputtering as a procedure for depositing a film of Cu-based metal and carrying out sputtering at room temperature, the crystal grains of the deposited Cu alloy film become fine so as to prevent crystal grain boundaries from penetrating the thin film. They have also found that the Cu-based metal must be a Cu alloy containing one or more alloying elements, since crystal grains of pure Cu grows slowly over several hours to several days after film deposition and do not become fine, even if the thin film is deposited by sputtering at room temperature. In this connection, electroplating and chemical vapor deposition (CVD) cannot be employed herein, since a thin film of a Cu alloy cannot be deposited according to these techniques.

Next, the present inventors made investigations on stability of crystal grain boundaries in a Cu alloy thin film having fine crystal grains. The stability of crystal grain boundaries was determined by measuring a stress-temperature curve of the thin film. In the measurement of stress-temperature curve, the stress of a sample thin film is measured while heating, in which a substrate undergoes deformation with change in temperature due to the difference in coefficient of thermal expansion between the substrate and the thin film, and the magnitude of deformation is measured to determine the stress. When the thin film begins plastically deforming at elevated temperatures, the stress begins decreasing. The temperature at which the stress begins decreasing is defined as the yield temperature (yield point) The change in stress is no more observed when the thin film exhibits full flowability at further elevated temperatures (hereinafter referred to as "high-temperature flowability") The present inventors made investigations on high-temperature flowability of Cu alloys containing a variety of alloying elements according to this technique.

Initially, a series of Cu alloy thin films containing any one of Ti (0.6 atomic percent), Sm (6.1 atomic percent), Y (1.7 atomic percent), Gd (2.0 atomic percent), Tb (1.8 atomic percent) and Ag (3.3 atomic percent) was deposited by sputtering on a barrier film of TaN having a thickness of 500 angstrom fabricated on a surface of silicon wafer. The stress-temperature curves of these thin films were determined. The values in the parentheses above are contents of alloying elements (the same is true hereinafter).

The barrier film (TaN film) was deposited by sputtering using a pure Ta target in an atmospheric gas containing Ar and 20% $N_2$ at a gas pressure of 667 mPa (5 mTorr), a discharge power of 3 $W/cm^2$, an anode-cathode distance of 55 mm, and a temperature of room temperature (20° C.).

The Cu alloy thin films were deposited by sputtering in an atmospheric gas containing Ar at a gas pressure of 266 mPa (2 mTorr), a discharge power of 3.3 $W/cm^2$, an anode-cathode distance of 55 mm, and a temperature of room temperature (20° C.) The sputtering targets used herein are Cu alloys containing any one of the alloying elements with the balance being Cu and inevitable impurities.

In the measurement of stress-temperature curve, a sample was heated in a $N_2$ atmosphere from room temperature (20° C.) to 500° C. at a temperature elevation rate of 5° C./min. The Cu alloy thin films containing any one of the above-mentioned alloying elements have yield points higher than that of the thin film of pure Cu (about 350° C.). Namely, the addition of the above elements increases the strength of the Cu alloy and reduces the high-temperature flowability. This is probably because the addition of the elements increases the hardness of the Cu alloy thin films due to solid-solution hardening or precipitation hardening.

Next, a series of thin films of Cu alloys containing any one of Mg (1.44 atomic percent), Sn (0.9 atomic percent) and In (2.3 atomic percent) was deposited by sputtering on a barrier film of TaN having a thickness of 500 angstroms fabricated on a surface of a silicon wafer. The stress-temperature curves of these thin films were determined. The sputtering and determination of the stress-temperature curves were carried out under the same conditions as above. The Cu alloy thin films containing any one of the above-mentioned alloying elements have yield points substantially equal to that of the thin film of pure Cu (about 350° C.). Namely, the addition of the above elements does not substantially contribute to exhibition of high-temperature flowability, as in pure Cu.

The crystal grain size of Cu in the Cu alloy thin films was determined. Specifically, the average size of crystal grains of a sample Cu alloy thin film deposited by sputtering at room temperature was determined immediately after film deposition and after subjecting the Cu alloy thin film to heat treatment at 450° C. in a 100% $N_2$ atmosphere for 30 minutes. The average size of crystal grains after heat treatment was determined as a simulation of high pressure and high temperature treatment after sputtering. The high pressure and high temperature treatment will be described later. If the Cu alloy thin film has an average size of crystal grains after heat treatment higher than that immediately after sputtering, it means that the Cu in the thin film shows an increased high-temperature flowability. The crystal grain size of Cu in the Cu alloy thin film was determined in the same way as after-mentioned Example 2. The Cu alloy thin films containing any one of Mg, Sn and In have an average size of crystal grains of about 0.01 μm immediately after sputtering and of about 0.05 μm after heat treatment. These results show that the addition of any one of Mg, Sn and In as an alloying element does not substantially contribute to growth of crystal grains of Cu and to movement and deformation of Cu even after heat treatment of the Cu alloy. Accordingly, the Cu alloy cannot be embedded in narrow grooves even if the Cu alloy thin film is deposited by sputtering and is subjected to high pressure and high temperature treatment.

Next, a series of thin films of Cu alloys containing any one of Sb (3.9 atomic percent), Bi (0.2 atomic percent) and Dy (1.0 atomic percent) was deposited by sputtering on a barrier film of TaN having a thickness of 500 angstroms fabricated on a surface of a silicon wafer. The stress-temperature curves of these thin films were determined. The sputtering and determination of the stress-temperature curves were carried out under the same conditions as above. The Cu alloy thin films containing any one of the above-mentioned alloying elements have yield points of 250° C., about 100° C. lower than that of the thin film of pure Cu (about 350° C.). The Cu alloy thin films were then heated to 300° C. or higher, and no change in stress was observed thereafter. These thin films are considered to exhibit good high-temperature flowability.

The crystal grain size of Cu in the Cu alloy thin film was determined in the same way as after-mentioned Example 2. The Cu alloy thin films containing any one of Sb, Bi and Dy have an average size of crystal grains of about 0.01 μm immediately after sputtering and have an increased average size of the crystal grains of about 1 μm after heat treatment. These results demonstrate that the presence of any one of Sb, Bi and Dy as an alloying element in Cu alloys contributes to the sufficient growth of crystal grains of Cu after heat treatment, to make crystal grain boundaries unstable. Thus, these Cu alloys can be reliably embedded in narrow grooves by subjecting the Cu alloy thin films to high pressure and high temperature treatment after sputtering, since Cu in the thin films moves and deforms to further extent.

The present inventors have also found that the state of the crystal grain boundaries is affected by temperature in film deposition by sputtering. When a thin film of a Cu alloy is deposited by sputtering at room temperature, crystal grains of Cu alloy in the deposited thin film become fine and crystal grain boundaries become unstable. In contrast, when the sputtering is carried out at elevated temperatures (e.g., at 300° C.), crystal grains of Cu alloy in the deposited thin film are rearranged as a result of heating, and the crystal grain boundaries become stable.

The Cu alloy for semiconductor interconnections according to the present invention comprises at least one selected from the group consisting of 0.10 to 10 atomic percent of Sb, 0.010 to 1.0 atomic percent of Bi, and 0.01 to 3 atomic percent of Dy, with the balance being Cu and inevitable impurities (e.g., Ag, Mg, Na, Fe and/or Si).

Sb, Bi and Dy are elements serving to cause crystal distortion in the Cu thin film to thereby make crystal grains of Cu fine. The Cu alloy having such fine crystal grains of Cu can be embedded in grooves on a semiconductor substrate, even if the grooves are narrow. Among these elements, Sb forms a solid solution in a matrix, and the dissolved Sb precipitates at relatively low temperatures in high pressure and high temperature treatment. The precipitated Sb moves around crystal grain boundaries while grains of Cu grow. Thus, the Cu alloy exhibits high-temperature flowability.

Mg or Ti may be added as an alloying element from the viewpoint of reducing the sizes of crystal grains of Cu. Mg or Ti, however, is dissolved in Cu to cause solid-solution hardening, and the resulting thin film becomes excessively hard. When the dissolved Mg or Ti precipitates in high pressure and high temperature treatment, the precipitated element does not move around crystal grain boundaries but causes precipitation hardening to thereby deteriorate high-temperature flowability of Cu.

Sb does not exhibit supplemental effects in a content less than 0.10 atomic percent. The Sb content is preferably 0.15 atomic percent or more, more preferably 0.76 atomic percent or more, and further preferably 1.30 atomic percent or more. Adding Sb in a content exceeding 10 atomic percent, however, causes excessive solid-solution hardening. Thus, the Cu alloy cannot be embedded in grooves on a semiconductor substrate even upon high pressure and high temperature treatment, since the resulting film becomes excessively hard. The Sb content is preferably 5 atomic percent or less, more preferably 4.0 atomic percent or less, and further preferably 3.50 atomic percent or less.

The Sb content is typically preferably from 0.76 to 4.0 atomic percent. Within this range, the Cu alloy can be embedded at relatively low temperatures in high pressure and high temperature treatment and can be easily embedded even in narrow grooves having widths of less than 0.15 μm.

Bi does not exhibit supplemental effects in a content less than 0.010 atomic percent. The Bi content is preferably 0.05 atomic percent or more, and more preferably 0.07 atomic percent or more. Adding Bi in a content exceeding 1.0 atomic percent, however, causes excessive solid-solution hardening. Thus, the Cu alloy cannot be embedded in grooves on a semiconductor substrate even upon high-pressure and high temperature treatment, since the resulting film becomes excessively hard. The Bi content is preferably 0.7 atomic percent or less, and more preferably 0.5 atomic percent or less.

Dy does not exhibit supplemental effects in a content less than 0.01 atomic percent. The Dy content is preferably 0.1 atomic percent or more, and more preferably 0.5 atomic percent or more. Adding Dy in a content exceeding 3 atomic percent, however, causes excessively fine Cu crystal grains. Thus, the Cu alloy cannot be embedded in grooves on a semiconductor substrate even upon high-pressure and high temperature treatment. The Dy content is preferably 2.5 atomic percent or less, and more preferably 2.1 atomic percent or less.

The effects of Sb, Bi and Dy can be obtained even in single use, but the combination use of two or more elements selected from the group consisting of Sb, Bi and Dy is also effective. The combination use serves to reduce the sizes of crystal grains in the Cu alloy thin film furthermore to thereby further increase high-temperature flowability. When Sb and Bi, for example, are used in combination, the contents of Sb and Bi may be 0.3 to 3.1 atomic percent and 0.01 to 0.5 atomic percent, respectively.

The Cu alloy for semiconductor interconnections according to another aspect of the present invention is deposited by sputtering and comprises at least one selected from the group consisting of Sb, Bi and Dy with the balance being Cu and inevitable impurities, in which the Cu alloy has an average size of crystal grains of 0.01 to 0.15 µm immediately after deposition by sputtering at room temperature, and, when the Cu alloy is subjected to heat treatment, the Cu alloy has an increased average size of the crystal grains of 0.5 µm or more after heat treatment.

Sb, Bi and Dy are elements serving to cause crystal distortion in the Cu thin film to thereby make crystal grains of Cu fine. In the Cu alloy having an average size of crystal grains of 0.01 to 0.15 µm immediately after deposition by sputtering at room temperature and having an increased average size of the crystal grains of 0.5 µm or more after heat treatment, Cu exhibits high-temperature flowability as a result of high pressure and high temperature treatment, and the Cu alloy can be reliably embedded in narrow grooves.

The "room temperature" herein refers to temperatures ranging from 10° C. to 60° C. Sputtering at elevated temperatures exceeding room temperature causes rearrangement of Cu due to heat in sputtering and thereby stabilizes crystal grain boundaries. The heat treatment may be carried out in an atmosphere of 100% $N_2$ at a temperature of 450° C. and a pressure of ordinary pressure (atmospheric pressure) for 30 minutes. The reason why "room temperature" includes temperatures up to 60° C. is that plasma used in sputtering inevitably causes temperature elevation.

The composition of the Cu alloy is not specifically limited, as long as the Cu alloy contains at least one selected from the group consisting of Sb, Bi and Dy as an alloying element with the balance being Cu and inevitable impurities, and as long as the Cu alloy has an average size of crystal grains of 0.01 to 0.15 µm immediately after deposition by sputtering at room temperature, and, when the Cu alloy is subjected to heat treatment, the Cu alloy has an increased average size of the crystal grains of 0.5 µm or more after heat treatment. To reliably satisfy the requirements in average size of crystal grains, the Cu alloy preferably contains at least one selected from the group consisting of 0.10 to 10 atomic percent of Sb, 0.010 to 1.0 atomic percent of Bi, and 0.01 to 3 atomic percent of Dy.

A method for fabricating interconnections by embedding a Cu alloy in grooves of a semiconductor substrate will be described below. For embedding a Cu alloy in grooves of a semiconductor substrate, it is important to deposit a film of a Cu alloy containing at least one of Sb, Bi and Dy on or above a surface of the semiconductor substrate by sputtering at room temperature. By covering the surface of the semiconductor substrate having grooves with the Cu alloy containing specific elements, the Cu alloy satisfactorily flows and is embedded in narrow grooves in the subsequent high pressure and high temperature treatment to thereby fabricate Cu alloy interconnections.

The sputtering is essentially carried out at room temperature. The sputtering at room temperature reduces the sizes of crystal grains of the Cu alloy covering the surface of the semiconductor substrate. Thus, the high-temperature flowability increases and the Cu alloy can be reliably embedded in narrow grooves as a result of the subsequent high pressure and high temperature treatment.

For sputtering, a sputtering target comprising at least one selected from the group consisting of 0.10 to 12 atomic percent of Sb, 0.020 to 3 atomic percent of Bi, and 0.02 to 3.5 atomic percent of Dy, with the balance being Cu and inevitable impurities may be used.

In general, films deposited by sputtering have substantially the same composition as that of a sputtering target. A Cu alloy film containing at least one of Sb, Bi and Dy deposited by sputtering, however, has a composition different from that of a sputtering target. This is because Sb, Bi and Dy have low melting points than Cu and they evaporate and scatter from the sputtering target upon sputtering. The sputtering target for use in the fabrication method according to the present invention must contain these alloying elements in somewhat larger amounts than the amounts of the elements to be contained in the deposited film of Cu alloy.

The thickness of the thin film of Cu alloy deposited by sputtering is not specifically limited and can be set according to, for example, the sizes and depths of the grooves. The thickness is generally about 1 to about 3 times the depth of the grooves. More specifically, the thickness may be about 0.5 to 3 µm. If the thickness is less than 0.5 µm, the Cu alloy may not be sufficiently embedded in grooves of a semiconductor substrate because of excessively small amount of Cu alloy. If it exceeds 3 µm, the Cu alloy may not be sufficiently embedded in the grooves even after high pressure and high temperature treatment, since the thin film of Cu alloy has an excessively large thickness.

The sputtering target for use in sputtering can have any configuration, such as a chip-on target or a Cu alloy target. The "chip-on target" comprises a base sputtering target, and a predetermined amount of metal chips containing specific element(s) arranged at predetermined positions on the base sputtering target. It is enough that the total composition of the base and the metal chips satisfies the above requirements. The "Cu alloy target" is a sputtering target containing specific amount(s) of the above-mentioned element(s) and satisfying the above requirements.

When a chip-on sputtering target is used, the composition of the Cu alloy to be deposited by sputtering can also be controlled by adjusting the positions and number (amount) of metal chips arranged on the base sputtering target. In a magnetron sputtering apparatus, there are positions susceptible to sputtering and positions resistant to sputtering. The position most susceptible to sputtering is called "erosion position." By controlling the distance between the erosion position and the position of the metal chips to be arranged and adjusting the number (amount) of the metal chips, the composition of the resulting Cu alloy can be controlled. In this connection, the position and number of the metal chips to be arranged vary from sputtering apparatus to another and cannot be specified uniformly.

Other sputtering conditions are not specifically limited and can be selected within conventional conditions. Sputtering may be carried out, for example, in an atmosphere of an inert gas such as Ar or He at a gas pressure of 66.7 to 1333 mPa (0.5 to 10 mTorr), a discharge power of 1 to 10 W/cm², and an anode-cathode distance of 20 to 100 mm.

An essential process of the fabrication method according to the present invention is depositing a film of a Cu alloy containing specific elements on or above a surface of a semiconductor substrate, and other conditions are not specifically limited.

The semiconductor substrate having grooves can be fabricated according to a conventional procedure. Specifically, a dielectric film is fabricated on a semiconductor substrate such as a silicon wafer, and an interconnection pattern including grooves in which interconnections are to be embedded and holes to connect the interconnections to each other (grooves) are fabricated.

The dielectric film can be fabricated according to any procedure. As the dielectric film, a film of, for example, silicon oxide, silicon nitride, boro-silicate glass (BSG), phospho-silicate glass (PSG) or boro-phospho-silicate glass (BPSG) may be fabricated.

The interconnection pattern can be fabricated according to any procedure. The interconnection pattern, however, should have a minimum width of 0.25 μm or less (excluding 0 μm) and a ratio of the depth to the minimum width of 1 or more. When the minimum width of grooves exceeds 0.25 μm, a Cu alloy can be easily embedded in the grooves even according to a procedure such as electroplating other than the fabrication method according to the present invention. In contrast, the method according to the present invention is directed to narrower grooves having a minimum width of 0.25 μm or less, where the Cu alloy cannot be directly embedded therein by electroplating. By using the fabrication method according to the present invention, the Cu alloy can be reliably embedded in grooves having a minimum width of, for example, 0.15 μm or less, less than 0.15 μm, 0.18 μm or less, 0.12 μm or less, 0.1 μm or less, or 0.09 μm or less, to thereby fabricate interconnections.

The depth of grooves in which Cu alloy interconnections are to be fabricated according to the method of the present invention should be preferably set so that the ratio of the depth to the minimum width is 1 or more. If the ratio is less than 1, namely, if the grooves has a relatively small depth with respect to the minimum width, a Cu alloy can be easily embedded in the grooves even according to a procedure such as electroplating other than the fabrication method according to the present invention. In contrast, the Cu alloy becomes more difficult to be embedded with an increasing ratio of the depth to the minimum width. The upper limit of the ratio is not specifically limited but is generally 10, since such grooves having a ratio of the depth to the minimum width [(depth)/(minimum width)] exceeding 10 are not practical.

In the case of trenches, the "minimum width of grooves" refers to the length (width) of the narrowest opening of the trenches. In the case of via holes, it refers to the diameter of opening of the holes. Specifically, if the via hole is elliptic, it refers to the minor axis. When grooves having different widths are arranged on a dielectric film, it is enough that the shortest width or diameter (or minor axis) of the grooves satisfies the above requirement.

A barrier film is arranged on or above a surface of the semiconductor substrate. If a Cu alloy is embedded directly in the grooves arranged on the dielectric film, Cu may diffuse into the dielectric film to thereby deteriorate the properties of the dielectric film. To avoid Cu from diffusing, the barrier film is arranged between the dielectric film and the Cu alloy.

Among possible materials for the barrier film, TiN or TaN is preferred for higher barrier property, namely, for higher capability of preventing Cu from diffusing. It is enough that the barrier film has such a thickness as to prevent Cu from diffusing into the dielectric film. The thickness is, for example, from about several nanometers to about several ten nanometers, such as about 5 to about 50 nanometers. An excessively large thickness of the barrier film, however, may prevent the miniaturization of the semiconductor device.

The high-pressure and high temperature treatment is carried out at 200° C. or higher and 50 MPa or more. The high pressure and high temperature treatment also serves to destroy micropores and bubbles other than gaps.

If the treatment temperature is excessively low of lower than 200° C., the Cu alloy may not exhibit sufficient high-temperature flowability and may not be embedded in grooves even upon pressurization. The treatment temperature is preferably 250° C. or higher, and more preferably 300° C. or higher. The upper limit of the treatment temperature is not specifically limited, but if the treatment is carried out at a temperature exceeding 650° C., the other components constituting the semiconductor device, such as the semiconductor substrate and the barrier film, may be damaged. Consequently, the treatment temperature is preferably 650° C. or lower, and more preferably 500° C. or lower.

If the treatment pressure is excessively low of less than 50 MPa, the Cu alloy may not be sufficiently embedded in grooves even when the Cu alloy has sufficient high-temperature flowability. The treatment pressure is preferably 70 MPa or more, and more preferably 100 MPa or more. The upper limit of the treatment pressure is not specifically limited, but an excessively high pressure exceeding 250 MPa is not practical. Consequently, the treatment pressure is preferably 250 MPa or less, and more preferably 210 MPa or less.

The treatment time is not specifically limited, but the holding time (retention time) at the highest temperature should be preferably about 10 minutes or less for sufficiently embedding the Cu alloy in the grooves.

The treatment atmosphere is not specifically limited as long as it is inert and includes, for example, Ar atmosphere and N₂ atmosphere.

Next, unnecessary Cu alloy is removed by chemical mechanical polishing (CMP), to yield interconnections. Then, another dielectric film is fabricated on a polished surface of the work, and the above processes are repeated to thereby yield multi-layer interconnections.

The present invention will be illustrated in further detail with reference to several experimental examples below which by no means limit the scope of the present invention. Any modification of such examples without deviating the scope of the present invention is within the technical range of the present invention.

EXPERIMENTAL EXAMPLE 1

Grooves having the shapes indicated in Table 1 were fabricated on a barrier film of TaN having a thickness of 500 angstroms, which barrier film had been fabricated on a 2-inch silicon wafer. A film of Cu or a Cu alloy was deposited thereon by DC magnetron sputtering, followed by high pressure and high temperature treatment. The "Trench" has a length of 100 μm. The "Hole" refers to a cylindrical depression, and its minimum width refers to the diameter of the hole.

The sputtering was carried out under the following conditions, using SM sputtering apparatus available from Shimadzu Corporation. As sputtering target, Cu alloys containing the additional elements listed in Table 1 with the balance being Cu and inevitable impurities were used. The symbol "-" in Table 1 represents pure Cu containing no additional elements.

As the target, either one of a chip-on target and a pure Cu (or Cu alloy) target was used. The "chip-on target" in Table 1 represents a sputtering target comprising a base pure Cu target, and a predetermined amount of metal chips containing specific elements and being arranged on the base sputtering target at predetermined positions. Specifically, the sputtering target used in No. 5 comprises ten 5-mm square Sb chips attached on a base pure Cu target (100 mm in diameter) at a distance of 4 mm from the center of the erosion position. The sputtering target used in No. 16 comprises ten 5-mm square Sb chips attached on a base pure Cu target (100 mm in diameter) at a distance of 2 mm from the center of the erosion position. The sputtering target used in No. 22 comprises ten 5-mm square Sb chips attached on a base pure Cu target (100 mm in diameter) at a distance of 3 mm from the center of the erosion position. The "alloy" herein represents a sputtering target containing a specific amount of any of the additional elements.

The film deposition by sputtering was carried out using Ar gas as an atmospheric gas at a gas pressure of 267 mPa (2 mTorr), a discharge power of 2.5 W/cm$^2$, an anode-cathode distance of 52 mm, and a film deposition temperature of room temperature (20° C.) or 300° C. The temperatures in film deposition and the film thickness of the deposited Cu alloy films are shown in Table 1 below. The film thickness of the deposited Cu alloy films was measured with a stylus surface profiler DEKTAK 6M available from Veeco Instruments.

The compositions of the films of Cu or Cu alloy deposited by sputtering were quantitatively analyzed by inductively coupled plasma (ICP) spectrometry with an inductively coupled plasma (ICP) spectrometer ICP-8000 available from Shimadzu Corporation. The results are shown in Table 1.

The high pressure and high temperature treatment was carried out under the conditions in Table 2 to thereby embed Cu or Cu alloy in the grooves. The treatment was conducted in an Ar atmosphere, and the work was held at the highest temperature shown in Table 2 for 5 minutes.

The resulting semiconductor devices having Cu or Cu alloy embedded in the grooves were subjected to focused ion beam (FIB) micromachining in their cross section using a focused ion beam apparatus "SEMI 9200" available from SII NanoTechnology Inc. and were subjected to scanning ion microscopic (SIM) observation (observation on secondary electron image excited by the action of ion) to find whether or not the Cu or Cu alloy was embedded in the grooves on the substrate. A sample in which the Cu or Cu alloy was fully embedded is evaluated as "Pass." One in which the Cu or Cu alloy was not fully embedded is evaluated as "Fail." The results are shown in Table 2.

TABLE 1

| | | Groove | | | | | Film deposition | | | | |
|---|---|---|---|---|---|---|---|---|---|---|---|
| | | | | Depth/ | Target composition | | | | Thick- | Cu alloy | |
| No. | Shape | Minimum width (μm) | Depth (μm) | Minimum width | Additional element | Content (atomic %) | Target configuration | Temperature (° C.) | ness (μm) | Additional element | Content (atomic %) |
| 1 | Hole | 0.14 | 0.5 | 3.57 | Sb | 4.1 | Alloy | RT | 1.2 | Sb | 3.9 |
| 2 | Hole | 0.14 | 0.5 | 3.57 | Sb | 2.7 | Alloy | RT | 1.2 | Sb | 2.5 |
| 3 | Hole | 0.14 | 0.5 | 3.57 | Sb | 0.13 | Alloy | RT | 1.2 | Sb | 0.12 |
| 4 | Hole | 0.14 | 0.5 | 3.57 | Sb | 4.8 | Alloy | RT | 1.2 | Sb | 4.5 |
| 5 | Hole | 0.14 | 0.5 | 3.57 | Sb | 9.4 | Chip-on | RT | 1.2 | Sb | 8.9 |
| 6 | Hole | 0.24 | 0.5 | 2.08 | Sb | 4.0 | Alloy | RT | 1.2 | Sb | 3.8 |
| 7 | Hole | 0.24 | 0.5 | 2.08 | Sb | 0.6 | Alloy | RT | 1.2 | Sb | 0.6 |
| 8 | Hole | 0.09 | 0.27 | 3.00 | Sb | 7.4 | Alloy | RT | 1.2 | Sb | 7 |
| 9 | Hole | 0.09 | 0.27 | 3.00 | Sb | 3.7 | Alloy | RT | 1.2 | Sb | 3.5 |
| 10 | Hole | 0.09 | 0.27 | 3.00 | Sb | 0.2 | Alloy | RT | 1.2 | Sb | 0.2 |
| 11 | Hole | 0.09 | 0.5 | 5.56 | Sb | 3.7 | Alloy | RT | 1.2 | Sb | 3.5 |
| 12 | Hole | 0.09 | 0.5 | 5.56 | Sb | 0.5 | Alloy | RT | 1.2 | Sb | 0.5 |
| 13 | Trench | 0.14 | 0.5 | 3.57 | Sb | 4.1 | Alloy | RT | 1.2 | Sb | 3.9 |
| 14 | Hole | 0.09 | 0.27 | 3.00 | — | — | pure Cu | RT | 1.2 | — | — |
| 15 | Hole | 0.09 | 0.5 | 5.56 | — | — | pure Cu | RT | 1.2 | — | — |
| 16 | Hole | 0.14 | 0.5 | 3.57 | Sb | 12.7 | Chip-on | RT | 1.2 | Sb | 12 |
| 17 | Hole | 0.14 | 0.5 | 3.57 | Sb | 0.04 | Alloy | RT | 1.2 | Sb | 0.04 |
| 18 | Hole | 0.14 | 0.5 | 3.57 | Bi | 0.6 | Alloy | RT | 1.2 | Bi | 0.2 |
| 19 | Hole | 0.14 | 0.5 | 3.57 | Bi | 2.7 | Alloy | RT | 1.2 | Bi | 0.9 |
| 20 | Hole | 0.14 | 0.5 | 3.57 | Bi | 0.06 | Alloy | RT | 1.2 | Bi | 0.02 |
| 21 | Hole | 0.14 | 0.5 | 3.57 | Bi | 0.015 | Alloy | RT | 1.2 | Bi | 0.005 |
| 22 | Hole | 0.14 | 0.5 | 3.57 | Bi | 6.0 | Chip-on | RT | 1.2 | Bi | 2 |
| 23 | Hole | 0.14 | 0.5 | 3.57 | Sb | 1.4 | Alloy | RT | 0.08 | Sb | 1.3 |
| 24 | Hole | 0.14 | 0.5 | 3.57 | Sb | 1.4 | Alloy | RT | 3.2 | Sb | 1.3 |
| 25 | Trench | 0.14 | 0.5 | 3.57 | Sb | 2.5 | Alloy | RT | 1.2 | Sb | 2.4 |
| 26 | Trench | 0.14 | 0.5 | 3.57 | Sb | 2.5 | Alloy | RT | 1.2 | Sb | 2.4 |
| 27 | Trench | 0.14 | 0.5 | 3.57 | Sb | 2.5 | Alloy | RT | 1.2 | Sb | 2.4 |
| 28 | Trench | 0.14 | 0.5 | 3.57 | Sb | 2.5 | Alloy | RT | 1.2 | Sb | 2.4 |
| 29 | Hole | 0.14 | 0.5 | 3.57 | Sb, Bi | Sb: 0.5, Bi: 0.12 | Alloy | RT | 1.2 | Sb, Bi | Sb: 0.4, Bi: 0.04 |
| 30 | Hole | 0.14 | 1 | 7.14 | Sb | 2.2 | Alloy | RT | 1.2 | Sb | 2.1 |
| 31 | Hole | 0.24 | 0.27 | 1.13 | — | — | pure Cu | 300 | 1.2 | — | — |

TABLE 2

| | High pressure and high temperature treatment | | |
|---|---|---|---|
| No. | Temperature (° C.) | Pressure (MPa) | Embedment |
| 1 | 600 | 200 | Pass |
| 2 | 600 | 200 | Pass |
| 3 | 600 | 200 | Pass |
| 4 | 600 | 200 | Pass |
| 5 | 600 | 200 | Pass |
| 6 | 600 | 200 | Pass |
| 7 | 600 | 200 | Pass |
| 8 | 450 | 200 | Pass |
| 9 | 450 | 200 | Pass |
| 10 | 450 | 200 | Pass |
| 11 | 300 | 150 | Pass |
| 12 | 300 | 150 | Pass |
| 13 | 450 | 200 | Pass |
| 14 | 450 | 200 | Fail |
| 15 | 300 | 150 | Fail |
| 16 | 450 | 200 | Fail |
| 17 | 450 | 200 | Fail |
| 18 | 450 | 200 | Pass |
| 19 | 450 | 200 | Pass |
| 20 | 450 | 200 | Pass |
| 21 | 600 | 200 | Fail |
| 22 | 600 | 200 | Fail |
| 23 | 450 | 200 | Fail |
| 24 | 450 | 200 | Fail |
| 25 | 450 | 80 | Pass |
| 26 | 450 | 45 | Fail |
| 27 | 250 | 200 | Pass |
| 28 | 180 | 200 | Fail |
| 29 | 300 | 150 | Pass |
| 30 | 600 | 200 | Pass |
| 31 | 600 | 200 | Fail |

Tables 1 and 2 show the following considerations. Sample Nos. 1 to 7 satisfy the requirements in the present invention, in which Cu alloys having different Sb contents were embedded in grooves. In these samples, the Cu alloys can be embedded satisfactorily. In Sample Nos. 8 to 10, Cu alloys were embedded under more severe conditions than those in Sample Nos. 1 to 5. Specifically, the grooves had smaller minimum widths, and the high pressure and high temperature treatment was carried out at lower temperatures. In these samples, however, the Cu alloys can be embedded satisfactorily. In Sample Nos. 11 and 12, Cu alloys were embedded under severe conditions. Specifically, the grooves had smaller minimum widths and larger ratios of the depth to the minimum width, and the high pressure and high temperature treatment was carried out at temperatures as low as possible. In these samples, the Cu alloys can be embedded satisfactorily. In Sample No. 13, the Cu alloy was embedded in trenches, and it was embedded satisfactorily. Sample Nos. 18 to 20 satisfy the requirements in the present invention, in which Cu alloys having different Bi contents were embedded in grooves. In these samples, the Cu alloys can be embedded satisfactorily. Comparison between Sample Nos. 25 and 26 shows that a Cu alloy cannot be embedded in the grooves if the treatment pressure, among the conditions for the high pressure and high temperature treatment, deviates from the requirement in the present invention. Comparison between Sample Nos. 27 and 28 shows that a Cu alloy cannot be embedded in the grooves if the treatment temperature, among the conditions for the high pressure and high temperature treatment, deviates from the requirement in the present invention. Sample No. 29 uses Sb and Bi in combination, in which the Cu alloy can be sufficiently embedded. In Sample No. 30, the ratio of the depth to the minimum width of the grooves is set larger than the other samples, and the Cu alloy can be embedded in the grooves to thereby fabricate good interconnections.

Sample Nos. 14 to 17, 21 to 22, and 31 are comparative samples out of the requirements specified in the present invention, in which the Cu alloys are not satisfactorily embedded. Sample Nos. 23 and 24 are referential samples, in which the thickness of the Cu alloy films deposited by sputtering is excessively thin or thick with respect to the depth of the grooves.

EXPERIMENTAL EXAMPLE 2

A series of films of Cu alloys was deposited by DC magnetron sputtering on a barrier film of TaN having a thickness of 500 angstroms, which barrier film had been fabricated on a 2-inch silicon wafer. The average size of crystal grains of Cu immediately after sputtering was determined.

The sputtering was carried out under the same conditions as in Experimental Example 1. As sputtering target, Cu alloys containing the additional elements listed in Table 3 with the balance being Cu and inevitable impurities were used. The configurations of the sputtering targets are shown in Table 3. The sputtering target used in No. 32 comprises ten 5-mm square Sb chips attached on a base pure Cu target (100 mm in diameter) at a distance of 3 mm from the center of the erosion position.

The conditions for film deposition by sputtering are the same as in Experimental Example 1. The deposition temperature is room temperature (20° C.), and the thickness of the deposited film of Cu alloy is 2.0 µm.

The compositions of the films of Cu alloy deposited by sputtering were quantitatively analyzed under the same conditions as in Experimental Example 1. The results are shown in Table 3.

The thin films of Cu alloys immediately after sputtering were subjected to focused ion beam (FIB) micromachining in their cross section using a focused ion beam apparatus "SEMI 9200" available from SII NanoTechnology Inc. and were subjected to scanning ion microscopic (SIM) observation (observation on secondary electron image excited by the action of ion). Thus, the average sizes of crystal grains of Cu in the thin films were determined. The results are shown in Table 3.

Next, the thin films of Cu alloy deposited by sputtering were subjected to heat treatment, and the average sizes of crystal grains of Cu immediately after heat treatment were determined.

The heat treatment was carried out in a 100% $N_2$ atmosphere at 450° C. under normal pressure (atmospheric pressure) for 30 minutes. After heat treatment, the thin films were subjected to focused ion beam (FIB) micromachining in their cross section using the focused ion beam apparatus and then to SIM observation. Thus, the average sizes of crystal grains of Cu were determined. The results are shown in Table 3.

Next, grooves having the shape indicated in Table 4 were fabricated on a 2-inch silicon wafer. A barrier film of TaN having a thickness of 500 angstroms was then fabricated thereon. A series of films of Cu alloys was deposited thereon by DC magnetron sputtering under the same conditions as above, followed by high pressure and high temperature treatment.

The high pressure and high temperature treatment was carried out under the conditions in Table 4 to thereby embed the Cu alloy in the grooves. The treatment was conducted in an Ar atmosphere in which the work was held at the highest temperature shown in Table 4 for 5 minutes.

The resulting semiconductor devices having Cu alloy embedded in the grooves were subjected to focused ion beam (FIB) micromachining in their cross section using the focused ion beam apparatus and were subjected to scanning ion microscopic (SIM) observation to determine whether or not the Cu alloy is embedded in the grooves on the substrate. The results are shown in Table 4.

TABLE 3

| | Target composition | | | Cu alloy | | Average grain size | |
|---|---|---|---|---|---|---|---|
| | | | | | | Immediately after sputtering (μm) | Immediately after heat treatment (μm) |
| No. | Additional element | Content (atomic %) | Target configuration | Additional element | Content (atomic %) | | |
| 32 | Sb | 12.7 | Chip-on | Sb | 12 | 0.08 | 0.2 |
| 33 | Sb | 4.1 | Alloy | Sb | 3.9 | 0.08 | 0.94 |
| 34 | Sb | 2.7 | Alloy | Sb | 2.5 | 0.14 | 0.95 |
| 35 | Sb | 0.05 | Alloy | Sb | 0.05 | 0.2 | 1 |
| 36 | Bi | 0.015 | Alloy | Bi | 0.005 | 0.95 | 0.96 |
| 37 | Bi | 0.03 | Alloy | Bi | 0.01 | 0.13 | 0.95 |
| 38 | Bi | 1.5 | Alloy | Bi | 0.5 | 0.1 | 0.55 |
| 39 | Bi | 3.6 | Alloy | Bi | 1.2 | 0.08 | 0.3 |
| 40 | Dy | 0.004 | Alloy | Dy | 0.004 | 0.2 | 0.85 |
| 41 | Dy | 1.1 | Alloy | Dy | 1.0 | 0.1 | 0.7 |
| 42 | Dy | 2.2 | Alloy | Dy | 2.0 | 0.02 | 0.55 |
| 43 | Dy | 3.9 | Alloy | Dy | 3.5 | 0.02 | 0.02 |
| 44 | Mg | 1.5 | Alloy | Mg | 1.4 | 0.12 | 0.25 |
| 45 | Ti | 0.7 | Alloy | Ti | 0.61 | 0.14 | 0.4 |

TABLE 4

| | Groove | | | Cu alloy | | High pressure and high temperature treatment | | |
|---|---|---|---|---|---|---|---|---|
| No. | Shape | Minimum width (μm) | Depth (μm) | Depth/Minimum width | Additional element | Content (atomic %) | Temperature (° C.) | Pressure (MPa) | Embedment |
| 32 | Hole | 0.18 | 0.5 | 3.57 | Sb | 11 | 600 | 200 | Fail |
| 33 | Hole | 0.18 | 0.5 | 3.57 | Sb | 3.9 | 600 | 200 | Pass |
| 34 | Hole | 0.18 | 0.5 | 3.57 | Sb | 2.5 | 600 | 200 | Pass |
| 35 | Hole | 0.18 | 0.5 | 3.57 | Sb | 0.05 | 600 | 200 | Fail |
| 36 | Hole | 0.18 | 0.5 | 3.57 | Bi | 0.005 | 600 | 200 | Fail |
| 37 | Hole | 0.18 | 0.5 | 3.57 | Bi | 0.01 | 600 | 200 | Pass |
| 38 | Hole | 0.18 | 0.5 | 3.57 | Bi | 0.5 | 600 | 200 | Pass |
| 39 | Hole | 0.18 | 0.5 | 3.57 | Bi | 1.2 | 450 | 200 | Fail |
| 40 | Hole | 0.18 | 0.5 | 3.57 | Dy | 0.001 | 450 | 200 | Fail |
| 41 | Hole | 0.18 | 0.5 | 3.57 | Dy | 0.003 | 450 | 200 | Pass |
| 42 | Hole | 0.18 | 0.5 | 3.57 | Dy | 0.2 | 300 | 150 | Pass |
| 43 | Hole | 0.18 | 0.5 | 3.57 | Dy | 0.5 | 300 | 150 | Fail |
| 44 | Hole | 0.18 | 0.5 | 3.57 | Mg | 1.4 | 450 | 200 | Fail |
| 45 | Hole | 0.18 | 0.5 | 3.57 | Ti | 0.61 | 450 | 200 | Fail |

Tables 3 and 4 demonstrate that Cu alloys satisfying the requirements in the present invention on average size of crystal grains immediately after sputtering and that immediately after heat treatment can be reliably embedded in grooves having a narrow minimum width and/or a large depth with respect to the minimum width by high pressure and high temperature treatment.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A Cu alloy comprising:
   at least two elements selected from the group consisting of:
   0.10 to 10 atomic percent of Sb,
   0.010 to 1.0 atomic percent of Bi, and
   0.01 to 3 atomic percent of Dy,
   with the balance being Cu and inevitable impurities,
   wherein the Cu alloy does not comprise silicon.

2. A Cu alloy for semiconductor interconnections, being deposited by sputtering and comprising at least two elements selected from the group consisting of Sb, Bi and Dy with the balance being Cu and inevitable impurities,
   wherein the Cu alloy does not comprise silicon,
   wherein the Cu alloy has an average size of crystal grains of 0.01 to 0.15 μm immediately after deposition by sputtering at room temperature, and wherein, when the Cu alloy is subjected to heat treatment, the Cu alloy has an increased average size of the crystal grains of 0.5 μm or more after heat treatment.

3. A sputtering target for fabricating Cu alloy interconnections for semiconductors, comprising:
at least two elements selected from the group consisting of:
0.10 to 12 atomic percent of Sb,
0.020 to 3 atomic percent of Bi, and
0.02 to 3.5 atomic percent of Dy,
with the balance being Cu and inevitable impurities,
wherein the Cu alloy does not comprise silicon.

4. A Cu alloy comprising:
0.010 to 1.0 atomic percent of Bi
with the balance being Cu and inevitable impurities,
wherein the Cu alloy does not comprise silicon.

5. A Cu alloy for semiconductor interconnections, being deposited by sputtering and comprising Bi with the balance being Cu and inevitable impurities,
wherein the Cu alloy does not comprise silicon,
wherein the Cu alloy has an average particle size of crystal grains of 0.01 to 0.15 μm immediately after deposition by sputtering at room temperature, and
wherein, when the Cu alloy is subjected to heat treatment, the Cu alloy has an increased average size of the crystal grains of 0.5 μm or more after heat treatment.

6. A sputtering target for fabricating Cu alloy interconnections for semiconductors, comprising
0.020 to 3 atomic percent of Bi,
with the balance being Cu and inevitable impurities,
wherein the Cu alloy does not comprise silicon.

7. The alloy of claim 1, comprising
0.10 to 10 atomic percent of Sb, and
0.010 to 1.0 atomic percent of Bi,
with the balance being Cu and inevitable impurities.

8. A Cu alloy, comprising
0.010 to 1.0 atomic percent of Bi, and
0.01 to 3 atomic percent of Dy,
with the balance being Cu and inevitable impurities.

9. A Cu alloy, comprising
0.10 to 10 atomic percent of Sb, and
0.01 to 3 atomic percent of Dy,
with the balance being Cu and inevitable impurities.

10. A Cu alloy, comprising
0.10 to 10 atomic percent of Sb,
0.010 to 1.0 atomic percent of Bi, and
0.01 to 3 atomic percent of Dy,
with the balance being Cu and inevitable impurities.

11. The sputtering target of claim 3, comprising
0.10 to 12 atomic percent of Sb, and
0.020 to 3 atomic percent of Bi,
with the balance being Cu and inevitable impurities.

12. A sputtering target for fabricating Cu alloy interconnections for semiconductors, comprising
0.10 to 12 atomic percent of Sb, and
0.02 to 3.5 atomic percent of Dy,
with the balance being Cu and inevitable impurities.

13. A sputtering target for fabricating Cu alloy interconnections for semiconductors, comprising
0.020 to 3 atomic percent of Bi, and
0.02 to 3.5 atomic percent of Dy,
with the balance being Cu and inevitable impurities.

14. A sputtering target for fabricating Cu alloy interconnections for semiconductors, comprising
0.10 to 12 atomic percent of Sb,
0.020 to 3 atomic percent of Bi, and
0.02 to 3.5 atomic percent of Dy,
with the balance being Cu and inevitable impurities.

* * * * *

UNITED STATES PATENT AND TRADEMARK OFFICE
CERTIFICATE OF CORRECTION

PATENT NO. : 7,385,293 B2
APPLICATION NO. : 11/229721
DATED : June 10, 2008
INVENTOR(S) : Mizuno et al.

It is certified that error appears in the above-identified patent and that said Letters Patent is hereby corrected as shown below:

On the title page, Item (73), the Assignee information is incorrect. Item (73) should read:

-- (73) Assignee: Kabushiki Kaisha Kobe Seiko Sho (Kobe Steel, Ltd.), Kobe-shi (JP) --

Signed and Sealed this

Twelfth Day of August, 2008

JON W. DUDAS
*Director of the United States Patent and Trademark Office*